United States Patent [19]

Barjonnet et al.

[11] Patent Number: 5,101,160
[45] Date of Patent: Mar. 31, 1992

[54] DIGITAL ISOLATION MONITOR FOR AN ELECTRICAL POWER SYSTEM

[75] Inventors: Jean P. Barjonnet, Meylan; Bruno Bouchez; Philippe Le Maitre, both of Grenoble, all of France

[73] Assignee: Merlin Gerin, Meylan, France

[21] Appl. No.: 524,798

[22] Filed: May 18, 1990

[30] Foreign Application Priority Data

May 19, 1989 [FR] France .................................. 89 06690

[51] Int. Cl.⁵ .................................................. G01R 31/08
[52] U.S. Cl. ........................................ 324/510; 324/520; 324/541; 324/551; 324/659; 324/676; 324/681; 324/711; 324/718
[58] Field of Search ............... 324/509, 510, 511, 525, 324/520, 551, 522, 649, 650, 519, 659, 676, 681, 710, 711, 677, 713, 718, 541

[56] References Cited

U.S. PATENT DOCUMENTS

| | | | |
|---|---|---|---|
| 3,569,826 | 3/1971 | Burnett | 324/510 X |
| 3,737,765 | 6/1973 | Lee et al. | 324/510 |
| 3,971,007 | 7/1976 | Borkovitz et al. | 324/510 X |
| 4,054,832 | 10/1977 | Reynolds et al. | 324/510 |
| 4,206,398 | 6/1980 | Janning | 324/509 |
| 4,472,676 | 9/1984 | Eichmann et al. | 324/509 |
| 4,528,497 | 7/1985 | Arato | 324/509 |
| 4,851,782 | 7/1989 | Jeerings et al. | 324/509 X |
| 4,896,115 | 1/1990 | LeMaitre et al. | 324/509 X |

FOREIGN PATENT DOCUMENTS

0297933 1/1989 European Pat. Off. .
3346387 7/1985 Fed. Rep. of Germany .

OTHER PUBLICATIONS

Patent Abstract of Japan, vol. 7, No. 134 (P-203) [1279] Jun. 11, 1983.

*Primary Examiner*—Kenneth A. Wieder
*Attorney, Agent, or Firm*—Parkhurst, Wendel & Rossi

[57] ABSTRACT

A digital isolation monitor comprises a digital processing signal processor P1 designed to synthesize a sine wave in real time by a table, and to send the digital values of this sine wave to a digital-to-analog converter of an input channel to generate a low-frequency AC reference signal with a very low, stable phase distortion factor. An acquisition channel is fitted with a switching unit operating in conjunction with a dual measurement circuit to send an injected voltage signal and a leakage current signal to a low-pass analog filter in series with a sample-and-hold circuit and an analog-to-digital converter. The processor P1 then performs synchronous demodulation and transmits the data to a microcontroller P2.

10 Claims, 2 Drawing Sheets

DIGITAL ISOLATION MONITOR FOR AN ELECTRICAL POWER SYSTEM

BACKGROUND OF THE INVENTION

The invention relates to an isolation monitor comprising:

an input circuit of a reference AC signal between the power system and earth, an electronic detection circuit supplying a measurement signal which is the image of the power system isolation, said isolation corresponding to an impedance Zd formed by a leakage resistor Rf electrically connected in parallel with a stray capacitor Cf, the capacitance of which depends on the characteristics of the power system, discrimination means of the resistive and capacitive components of the measurement signal, and computation and indication means of the modules of said components to display the values of the leakage resistance Rf and of the stray capacitor Cf on display and alarm means.

The document FR-A 2,616,228 describes an isolation monitor containing a generator which applies a low-frequency reference AC voltage to the power system, and a synchronous analog detector having a pair of solid-state inverters processing the resistive and capacitive components of the measurement signal proportional to the isolation impedance. A converter is connected to the generator to deliver two control signals in quadrature to control the inverters, one of the control signals being in phase with the reference AC signal applied to the power system by a generator. The precision of the monitor depends on the phase stability of the measurement channel. The use of a generator with a synchronous analog detector is liable to make the phase distortion factor vary according to the characteristics of the electronic components, which gives rise to measurement errors.

The object of the invention consists in improving the measurement precision of a isolation monitor.

SUMMARY OF THE INVENTION

The isolation monitor according to the invention is characterized in that it comprises a digital processing signal processor P1 designed to synthesize a sine wave in real time by a table stored in a memory, and to send digital values of this sine wave to a digital-to-analog converter CNA of an input channel to generate the AC frequency signal, and that the detection circuit is provided with an acquisition channel having a low-pass analog filter connected by means of a sample-and-hold circuit to an analog-to-digital converter CAN delivering a filtered digital measurement signal which is processed by synchronous demodulation in said processor P1.

The frequency of the reference AC signal injected in the power system by the input channel is a sub-multiple of the power system frequency. The processor P1 synthesizes the sine wave by points using the formula:

$$\sin(A + b) = \sin(A)\cos(b) + \sin(b)\cos(A)$$

in which the first parameter A is scaled from 0 to 90 degrees in predetermined steps m1 equal to 90/n, and the second parameter b is scaled from 0 to m1 degrees in predetermined steps m2 equal to m1/n.

Digital generation by the processor of the reference AC signal enables a very low, stable phase distortion factor to be obtained. The measurement channel then introduces a minimum phase error in the processor for processing by synchronous demodulation. This phase stability enhances the precision of the monitor.

The acquisition channel operates in conjunction with a dual measurement circuit delivering a first signal S1 and a second signal S2 respectively representing the voltage injected in the power system, and the leakage current flowing in the impedance Zd, and comprises a switching unit formed by an analog multiplexer designed to accept alternately the first signal S1 from the resistance bridge R1–R2 of the first measurement circuit connected to the power system, and the second signal S2 taken at the terminals of a measurement resistor R3 of the earthed second measurement circuit, switching of the switching unit being controlled by the signal processor P1.

After digital filtering and processing by synchronous demodulation, the processor transmits the data to a microcontroller which computes the values of the leakage resistance, the stray capacitor, and the earth resistance in deferred time.

The microcontroller P2 is associated with:

a keyboard with control keys to enter the data and scroll the display, a first alphanumeric read-out to display the values of the leakage resistance Rf, the stray capacitor Cf, and the earth resistance Rt, a second bar graph read-out to give permanent indication of the isolation level with respect to alarm and pre-alarm thresholds, an alarm device with signalling relays supplied in the event of said thresholds being exceeded, and a communication interface with a bus to transmit or receive data from a external transceiver device.

Digital sealing with a secret code is programmed inside the microcontroller P2, and modification of the parameters via the keyboard is only authorized if the code entered complies.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

Figure 1:
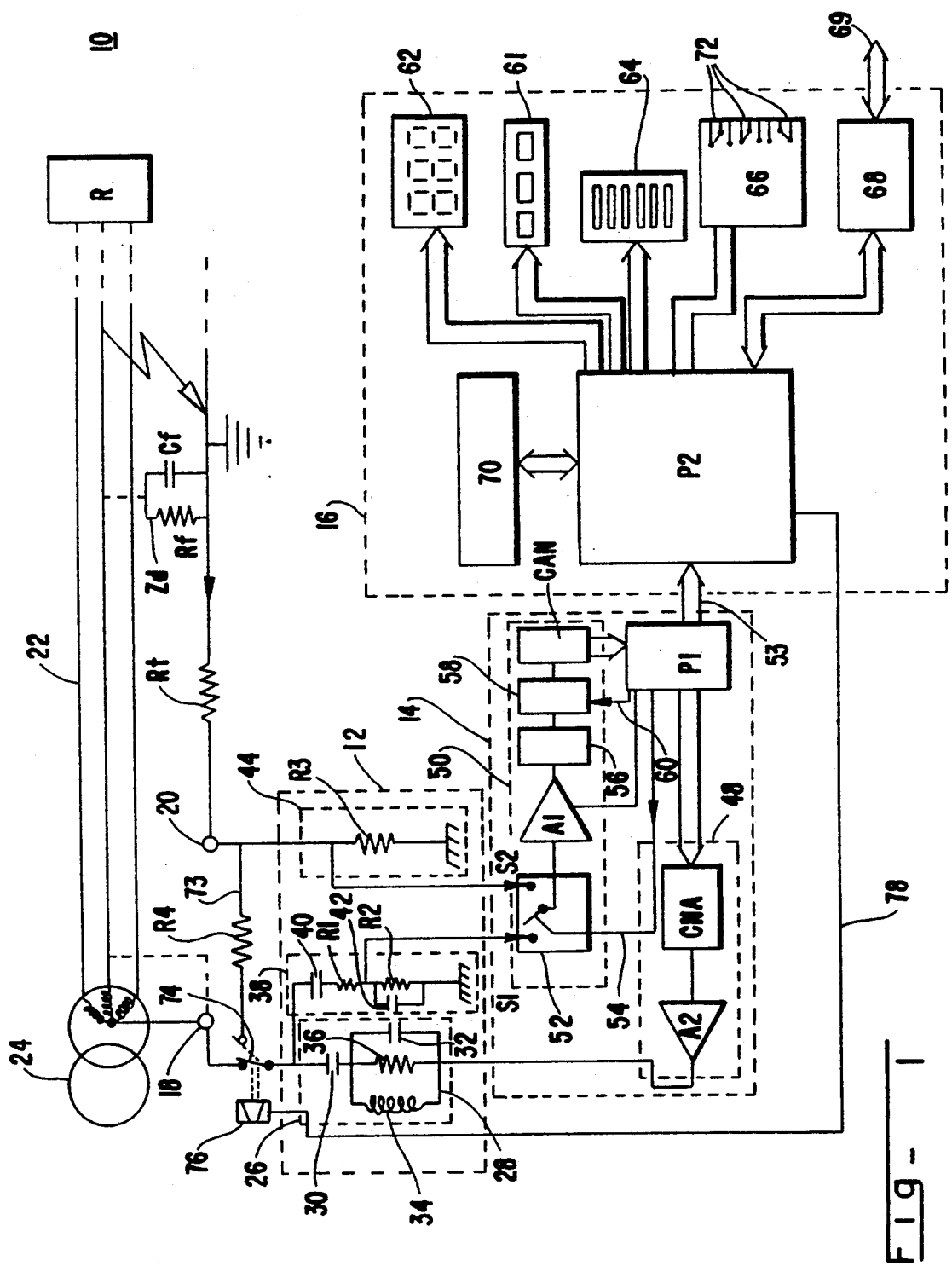
FIG. 1 is a block diagram of the digital isolation monitor according to the invention.

In FIG. 1, a digital isolation monitor 10 is formed by association of three functional units 12, 14, 16 arranged to form an input circuit of a low-frequency AC reference signal between the power system and earth, and a detection and processing circuit supplying a power system isolation image signal. The monitor is provided with two connection terminals 18, 20, one 18 of which is connected to the power system 22, and the other of which is at earth potential.

The power system 22 represented in FIG. 1 is a three-phase AC power system with isolated neutral (IT neutral system), but it is clear that the power system configuration can be different (TN or TT neutral system). In the case of the IT system in FIG. 1, the input terminal 18 is connected either to the neutral of the medium-voltage/low-voltage power transformer 24, or directly to one of the phase conductors (dashed line connection). The power system 22 supplies at least one load R connected opposite from the power transformer. The frequency of the AC system is 50 Hz, 60 Hz or 400 Hz according to the nature of the electrical installation or the country.

Figure 2:
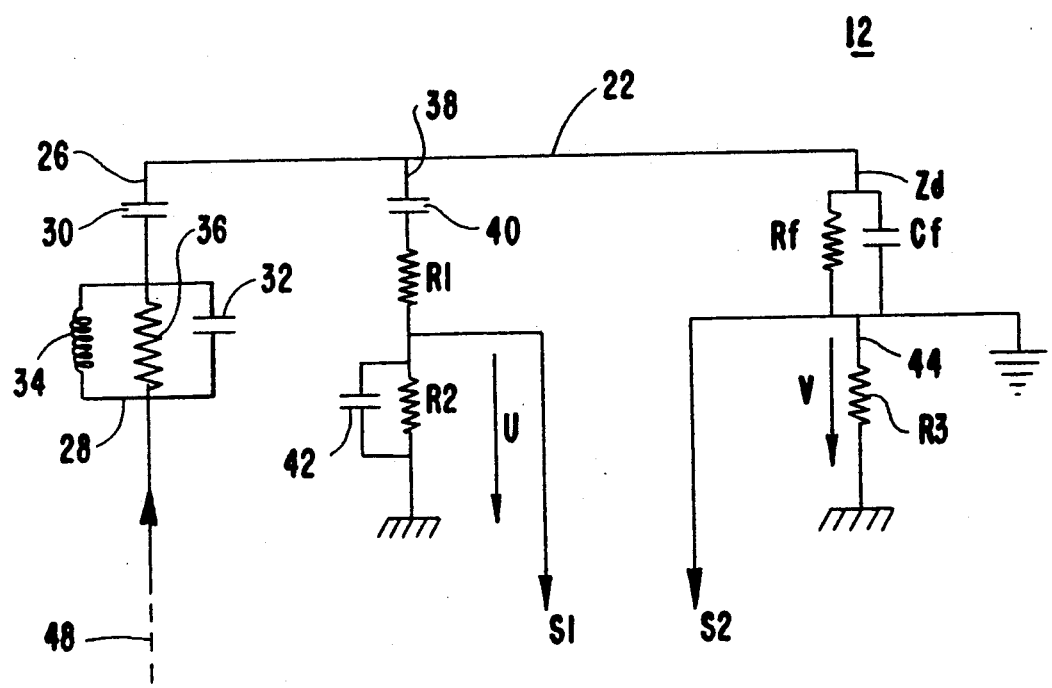
FIG. 2 is a partial view of FIG. 1, representing the equivalent diagram of the input filter and of the dual measurement circuit.

The first functional unit 12 (see FIGS. 1 and 2) comprises an input filter 26 having a trap circuit 28 tuned to the power system frequency. A capacitor 30 inserted between the trap circuit 28 and the terminal 18 is fitted to interrupt the DC component of the AC power system 22, or to interrupt the DC current in the case of use on a DC power system. The trap circuit 28 is constituted by parallel connection of a capacitor 32, an inductance coil 34 and a resistor 36, the function of the latter being to prevent the ferroresonance phenomenon.

To calculate the isolation level of the power system, the value of the voltage injected and the current flowing in the fault impedance Zd between the power system and earth have to be known.

The input filter 26 has connected to it on the power system side a first voltage measurement circuit 38 comprising a resistance bridge (R1-R2) to measure the voltage injected. A series capacitor 40 enables the DC component of the power system 22 to be interrupted, and a capacitor 42 connected in parallel to the resistor R2 attenuates the power system AC component. The resistor R2 is connected to ground, and the image of the voltage injected is taken at the interconnection point of the resistors of the resistance bridge R1-R2.

A measurement resistor R3 of a second voltage measurement circuit 44 is connected between the terminal 20 and ground, so as to be in series with the fault impedance Zd of the power system. The voltage V taken at the terminals of the resistor R3 is proportional to the leakage current Id flowing in the fault impedance Zd.

The isolation level computation principle stems from the dual measurement of the output signals S1 and S2 of the first and second voltage measurement circuits 38, 44 of the first unit 12 :

If the voltage U measured at the terminals of the resistor R2 is the image of the voltage injected, the actual voltage U1 injected in this system is given approximately by the relationship :

$$U1 = U (R1 + R2)/R2 \quad (1)$$

the impedances of the capacitors 40, 42 not being taken into account.

Furthermore, if V is the voltage measured at the terminals of the resistor R3, the current Id flowing in the fault is given by the relationship :

$$Id = V/R3 \quad (2)$$

The voltage U2 at the terminals of the fault impedance Zd has the value $U2 = U1 - V$. The fault impedance Zd is represented by the relationship :

$$\begin{aligned} Zd &= U2/ID \\ &= (U1 - V)/Id \\ &= (U1 - V) \cdot R3/V \end{aligned} \quad (3)$$

$$Zd = R3/V [U (R1+R2)/R2 - V] \quad (4)$$

It can be noted that the fault impedance Zd depends on the values of the resistors R1, R2, R3 of the two measurement circuits 38, 44, and on the values of the voltages U and V which are respectively proportional to the voltage injected in the power system and to the leakage current Id flowing in the fault impedance Zd.

All these values being known by construction and by measurement, the fault impedance Zd can be determined, without taking account of the characteristics of the input filter 26. The dual measurement process of the voltages U and V to compute the impedance Zd then enables the manufacturing tolerances of the components, notably the inductance coil 34 and the capacitors 30, 32 of the input filter 26, to be by-passed.

The second functional unit 14 (FIG. 1) comprises a signal processor P1 associated with :
  an input channel 48 connected to the trap circuit 28;
  an acquisition channel 50 of the output signals S1 and S2 of the first and second measurement circuits 38, 44 respectively representing the values of the voltage injected in the power system and of the fault current in the impedance Zd;
  a communication link 53 with a microcontroller P2.

The signal processor P1 is a specific ultra-fast digital microprocessor enabling multiplications and divisions of 16-bit numbers to be performed in a single instruction.

The acquisition channel 50 comprises a switching unit 52 formed by a CMOS analog multiplexer designed to alternately accept the first signal S1 and the second signal S2 from the unit 12. The switching order is generated by the processor P1 and sent to the switching unit 52 via a link conductor 54. The output of the switching unit 52 is connected to a first variable gain amplifier A1, which amplifies the signal S1 or the signal S2. The signal obtained then passes through a low-pass analog filter 56 designed to prevent spectrum aliasing on digitalization. The filtered signal is sent to a sample-and-hold circuit 58, and is then converted by means of an analog-to-digital converter CAN. The sample-and-hold circuit 58 is controlled by clock signals generated by the processor P1, and conveyed by a link conductor 60. The digitalized data is sent to the signal processor P1 which performs synchronous demodulation, and adjusts the gain of the amplifier A1.

The input channel 48 comprises a digital-to-analog converter CNA connected to the signal processor P1, and a second amplifier A2 inserted between the converter CNA and the trap circuit 28. The input channel 48 of the second unit 14 uses a part of the resources of the signal processor P1 to digitally synthesize the sinusoidal signal injected at low frequency in real time.

The processor P1 generates the sinusoidal signal injected on 1024 points. Given that a digital component is involved, generation of the sine wave is accomplished by computation using the following formula :

$$\sin (A + b) = \sin (A) \cos (b) + \sin (b) \cos (A)$$

To do this, A is used as the "rough" parameter : A is scaled from 0 to 90 degrees in steps of $90/16 = 5.625$ degrees. b is used as the "fine" parameter : b is scaled from 0 to 5.625 degrees in steps of $5.625/16 = 0.351$ degrees.

Four tables of 16 data items each are stored in a memory of the processor P1 :
 a sine (A) table
 a cosine (A) table
 a sine (b) table
 a cosine (b) table To generate a sine wave, we first take A =0 and b is scaled from 0 to 5.625, then A =5.625 and b is scaled from 0 to 5.625, then A =11.25 and b is scaled from 0 to 5.625 etc. Generation of 0 to 90 degrees of the sine wave is therefore made up of 256 points.

Over 90 degrees, the tables merely have to be run through in the reverse order to obtain the sine wave decrease. Over 180 degrees, the sign of the result merely has to be inverted following the same method (with a change in the reading direction of the table at 270 degrees).

It can be noted that only a quarter of a sine wave is stored in memory. This results in a saving in memory space in the processor P1.

Processing by synchronous demodulation in the processor P1 also requires the cosine of the input signal to be known. The same principle is used knowing that :

$$\cos (A +b) = \cos (A) \cos (b) - \sin (b) \sin (A)$$

The same tables are used.

The digital values of the sine wave thus obtained are sent to the digital-to-analog converter CNA which transforms them into an analog voltage. The sine function is used as it begins at 0 at t =0. The amplifier A2 supplies the necessary current for injection in the power system, after passing through the input filter 28. The frequency of the AC input signal is a submultiple of the power system frequency, as described in detail further on.

After the low-pass filter 56 has eliminated the HF interference signals and the noise notably of frequencies higher than 100 Hz, which could be brought into the useful input frequency band after sampling, the signal processor P1 performs a first digital filtering consisting in cutting the spectrum at 264 Hz and then decimates the samples by taking one sample out of eight. This amounts to sampling at a frequency eight times lower. The processor P1 then performs a digital filtering, eliminating the 50 Hz frequency on the digitized signals images of the input voltage and of the leakage current. The digital filtering process consists in cutting the spectrum at 12 Hz, giving a rejection of 60 dB at least at 50 Hz. The structure of the digital filters is for example of the recursive Chebyshev type.

The signal processor P1 then performs synchronous demodulation, the process of which consists in multiplying the filtered digital signal by the phase shift sine, and then integrating it to obtain the real part of the output signal S1 or S2. The imaginary part of this signal S1 or S2 is obtained in a similar way by multiplying the filtered digital signal by the cosine, and then integrating.

Synchronous demodulation has the particularity of rejecting all the harmonic frequencies of the input signal frequency. For this reason, the input frequency will be a sub-multiple of 50 Hz, notably 10, 5, 2.5 or 1 Hz. To improve the measurement precision, it is necessary to work at a low frequency. Depending on the case, the processor P1 will work at 10 Hertz (low capacitive power systems), 5 Hertz (capacitive power systems) or 2.5 and even 1 Hertz for very capacitive power systems.

Digital generation of the input signal by the input channel 48 gives rise to a very low and very stable phase distortion factor. This feature is advantageously profitable to the synchronous demodulation principle implemented in the processor P1 and which requires a minimum of phase error in the acquisition channel 50.

It can moreover be noted that the earth resistor Rt (shown by a dashed line in FIG. 1), electrically inserted between the fault impedance Zd and the terminal 20 of the isolation monitor 10, affects the accuracy of the isolation measurement, as the earth resistor Rt is connected in series with the leakage resistor Rf. Intermittent operation of the signal processor P1 at two different frequencies, for example 10 Hz and 5 Hz, will enable the value of the earth resistance Rt in the microcontroller P2 to be calculated.

The gain control of the amplifier A1 of the acquisition channel 50 operates as follows :

The signal processor P1 computes the square of the module of the filtered digital signal S1 or S2 corresponding to the voltage injected and the isolation current. If this module exceeds Vmax/2 (Vmax being for example equal to 10 volts), there is a risk of saturation at the amplifier A1 level. The processor P1 then adjusts the gain of the amplifier A1 to the immediately lower gain. If this module is lower than Vmax/4, the processor adjusts the gain of the amplifier A1 to the immediately higher gain. This results in the signal received by the processor P1 always having maximum dynamics.

At the end of each measurement sequence corresponding to an amplitude adjustment, a digital filter stabilization time, and a measurement time, the processor P1 sends the microcontroller P2 four types of measurement for each working frequency 10 Hz and 5 Hz :
 real part of the current signal and the associated gain,
 imaginary part of the current signal,
 real part of the voltage signal and the associated gain,
 imaginary part of the voltage signal.

In the third functional unit 16, the microcontroller P2 uses the data transmitted by the signal processor P1 to compute the values of the isolation resistance Rf, the capacitance Cf of the system and the earth resistance Rt. It manages a keyboard 61, the read-outs 62, 64, the controls of an alarm device 66 and a communication interface 68 with a data transmission bus 69. The microcontroller P2, by means of a backed-up power supply to the memory zone 70, enables faults, in particular of a fleeting nature, and the configuration of the equipment to be stored in memory in the event of a power supply outage. The microcontroller P2 uses the relationship (4) above to compute the values Rf, Cf and Rt. The microcontroller P2 works with a slight time lag and is not as fast as the signal processor P1 which works in real time on each supply of samples. The displays managed by the microcontroller P2 comprise :
 an alphanumeric read-out 62,
 a bar graph type read-out 64.

The alphanumeric read-out gives the values of the isolation resistance Rf, the system capacitance Cf, and the earth resistance Rt in plain language. The read-out 62 displays a "menu" proposing parameter read, parameter programming, test mode run or alarm acknowledgement. The data can be displayed on the read-out 62 in different languages by means of predetermined programming.

The bar graph read-out 64 permanently indicates the isolation level with respect to an alarm threshold and a pre-alarm threshold. A green coloring indicates an isolation higher than the pre-alarm threshold (high isolation threshold), and a yellow coloring indicates an isolation lower than the pre-alarm threshold but higher than the alarm threshold. A red coloring indicates an isolation lower than the pre-alarm and alarm thresholds. The lighted segment situates the isolation with respect to the thresholds.

The keyboard 61 comprises a limited number of non-specific keys : the bottom line of the alphanumeric display screen of the read-out 62 defines the function of each of the keys. The keyboard 61 enables data (thresholds) to be entered, the display to be scrolled, and a test mode to be run.

The alarm device 66 comprises relays 72 triggered when the thresholds are exceeded. One of the relays 72 is triggered when the pre-alarm threshold is exceeded, and two other relays 72 are triggered when the alarm threshold is exceeded.

The communication interface 68 with the bus 69 enables data to be transmitted or received from an external transceiver device. The data transmitted can be the value of the isolation resistance, the line capacitance, the value of fleeting faults, etc. The data received are modifications of the threshold values, requests for information, etc.

A test device of the monitor 10 comprises a test circuit 73 having a test resistor R4 one of the ends of which is connected to the terminal 20, and the other end of which can cooperate with a bistable contact 74 of a control relay 76. When the relay 76 is not energized, the contact 74 opens the test circuit 73, but closes the input filter 26 circuit, allowing the LF sine wave signal generated by the signal processor P1 to be input to the power system.

The test mode operates by pressing the test key of the keyboard 61 resulting in an excitation order of the relay 76 being sent by the conductor 78 of the microcontroller P2. The contact 74 is then switched to the position represented by the dashed line, so as to close the test circuit 73, and prevent the LF sine wave signal from being input to the power system. Insertion of the test resistor R4 simulates an isolation fault occurring at the input of the monitor 10 between the terminals 18, 20. This fault is accepted by the acquisition channel 50 and the signal processor P1, and is then displayed on the screen of the read-out 62 by the controller P2.

Digital sealing with a secret code is programmed inside the microcontroller P2, and a code key is accessible on the keyboard 61 to enable new parameters to be entered if the code complies

We claim:

1. An isolation monitor for monitoring an isolation of a power system with respect to a ground, comprising:
   input circuit means for injecting a reference AC signal at a frequency less than that of said power system between said power system and said ground;
   detection circuit means for supplying a measurement signal which is the image of said power system isolation, said isolation corresponding to an impedance Zd formed by a leakage resistor Rf electrically connected in parallel with a stray capacitor Cf, the capacitance of which depends on the characteristics of the power system;
   an acquisition channel means connected to said detection circuit means and having a low-pass analog filter connected by means of a sample-and-hold circuit to an analog-to-digital converter for generating a filtered digital representation of said measurement signal;
   a digital processor P1 for synchronously demodulating said filtered digital representation of said measurement signal to obtain the resistive and capacitive components thereof and for synthesizing a sine wave in real time based on said demodulated signal using a table stored in a memory, and further for sending said synthesized sine wave to a digital-to-analog converter for generation of said AC reference signal; and
   computation and display means for computing the values of said leakage resistance Rf and said leakage capacitance Cf from said resistive and capacitive components and for displaying same;
   wherein said acquisition channel operates in conjunction with first and second measurement circuits, said first measurement circuit located between said power system and a trap circuit tuned to the power system frequency for measuring a signal S1 indicative of the true AC signal injected on to the power system; and said second measurement means for measuring a signal S2 indicative of the leakage current flowing in the impedance Zd; and
   wherein said digital processor is connected to and controls a switching means which receives signals S1 and S2 for selectively entering one of the signals S1 and S2 into the acquisition channel.

2. The isolation monitor according to claim 1 wherein the frequency of the reference AC signal is a sub-multiple of the power system frequency, and the processor P1 synthesizes the sine wave by using the formula:

$$\sin(A+B) = \sin(A)\cos(b) + \sin(b)\cos(A),$$

in which the first parameter A is scaled from 0 to 90 degrees in predetermined steps m1 equal to 90/n, and the second parameter b is scaled from 0 to m1 degrees in predetermined steps m2 equal to m1/n.

3. The isolation monitor according to claim 1, wherein an output of the digital-to-analog converter is connected by means of an amplifier A2 to an input filter incorporated in said trap circuit.

4. The isolation monitor according to claim 3, wherein the acquisition channel is fitted with a switching unit formed by an analog multiplexer designed to accept alternately the first signal S1 from a resistance bridge R1–R2 of the first measurement circuit connected to the power system, and the second signal S2 taken at the terminals of a measurement resistor R3 of the second measurement circuit, switching of the switching unit being controlled by the signal processor P1.

5. The isolation monitor according to claim 4, wherein a variable gain amplifier A1 is inserted between the switching unit and the analog filter to amplify said first and second signals S1 and S2 from the first and second measurement circuits adjustment of the gain of the amplifier A1 being performed by the processor P1 according to the value of the filtered digital signal at the output from the analog-to-digital converter.

6. The isolation monitor according to claim 5, wherein the processor P1 performs digital filtering eliminating the stray frequencies in the digitalized signals of the AC reference signal and the leakage current, followed by processing by synchronous demodulation consisting in multiplying said digitalized signals by the sine and cosine of the phase shift, and at the end of each measurement and integration sequence, the processor P1 sends data concerning the real and imaginary parts of the AC reference and leakage current signals to a microcontroller P2 via a link.

7. The isolation monitor according to claim 6, wherein the microcontroller P2 computes in deferred time the values of the leakage resistance Rf, the stray capacitor Cf, and the earth resistance Rt located between the impedance Zd and the measurement resistor R3, following intermittent operation of the processor P1 at two different frequencies.

8. The isolation monitor according to claim 7, wherein the microcontroller P2 is associated with:
- a keyboard with control keys to enter data and scroll a display,
- a first alphanumeric read-out to display the values of the leakage resistance Rf, the stray capacitor Cf, and the earth resistance Rt,
- a second bar graph read-out to give permanent indication of the isolation level with respect to alarm and pre-alarm thresholds,
- an alarm device with signalling relays supplied in the event of said thresholds being exceeded,
- and a communication interface with a bus to transmit or receive data from an external transceiver device.

9. The isolation monitor according to claim 8, further comprising digital sealing with means for preventing access to parameters within the microcontroller P2 with a secret code programmed inside the microcontroller P2, and a code key accessible on the keyboard to enable the parameters to be modified if an entered code complies.

10. The isolation monitor according to claim 8, wherein the keyboard comprises a test key designed to send via the microcontroller P2 an excitation order to a control relay arranged to connect a test resistor R4, and to disconnect the input filter from the power system.

* * * * *